(12) United States Patent
Yamamoto

(10) Patent No.: US 11,460,700 B2
(45) Date of Patent: Oct. 4, 2022

(54) IMAGE DISPLAY MODULE AND IMAGE DISPLAY DEVICE

(71) Applicant: SEIKO EPSON CORPORATION, Tokyo (JP)

(72) Inventor: Hidetoshi Yamamoto, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 180 days.

(21) Appl. No.: 16/514,293

(22) Filed: Jul. 17, 2019

(65) Prior Publication Data
US 2020/0026083 A1 Jan. 23, 2020

(30) Foreign Application Priority Data
Jul. 18, 2018 (JP) .............................. JP2018-135018

(51) Int. Cl.
*G02B 27/01* (2006.01)
*G02B 27/14* (2006.01)

(52) U.S. Cl.
CPC ....... *G02B 27/0172* (2013.01); *G02B 27/149* (2013.01); *G02B 2027/0114* (2013.01); *G02B 2027/0178* (2013.01)

(58) Field of Classification Search
CPC ............ G02B 27/0172; G02B 27/149; G02B 2027/0114; G02B 2027/0178; G02B 27/102; G02B 27/1006; G02B 27/1013; G02B 27/1026; G02B 27/1033; G02B 27/104; G02B 27/1046; G02B 27/1053; G02B 27/1086; G02B 27/14; G02B 27/141; G02B 27/142; G02B 27/143; G02B 27/144; G02B 27/145; G02B 27/146;
(Continued)

(56) References Cited

U.S. PATENT DOCUMENTS 6,089,718 A * 7/2000 Hashizume .......... H04N 9/3167
348/E9.027
6,152,566 A 11/2000 Hashizume
(Continued)

FOREIGN PATENT DOCUMENTS

JP   H10-186547 A   7/1998
JP   2012-230151 A  11/2012
(Continued)

*Primary Examiner* — Thomas K Pham
*Assistant Examiner* — Henry A Duong
(74) *Attorney, Agent, or Firm* — Oliff PLC

(57) ABSTRACT

An image display module according to the present disclosure includes a first panel configured to emit first imaging light of a red wavelength region having no polarization characteristics, a second panel configured to emit second imaging light of a blue wavelength region having no polarization characteristics, a third panel configured to emit third imaging light of a green wavelength region having no polarization characteristics, and a color combined prism configured to emit combined light combined from the first imaging light, the second imaging light, and the third imaging light. The color combined prism includes a first dichroic mirror having no polarization separation characteristics, and a second dichroic mirror having no polarization separation characteristics, and a peak wavelength in the red wavelength region is equal to and greater than 630 nm and equal to or less than 680 nm.

6 Claims, 6 Drawing Sheets

(58) Field of Classification Search
CPC . G02B 27/147; G02B 27/148; H01L 51/5262; H01L 51/5265
USPC ........................................................ 359/634
See application file for complete search history.

(56) References Cited

U.S. PATENT DOCUMENTS 6,882,379 B1 * 4/2005 Yokoyama ......... G02B 27/1033
349/61
9,010,938 B2 * 4/2015 Akiyama ............. G02B 27/149
353/34

FOREIGN PATENT DOCUMENTS

| JP | 2014-048392 A | 3/2014 |
|----|---------------|--------|
| WO | 2009/041038 A1 | 4/2009 |

* cited by examiner

IMAGE DISPLAY MODULE AND IMAGE DISPLAY DEVICE

The present application is based on, and claims priority from JP Application Serial Number 2018-135018, filed Jul. 18, 2018, the present disclosure of which is hereby incorporated by reference herein in its entirety.

BACKGROUND

1. Technical Field

The present disclosure relates to an image display module and an image display device.

2. Related Art

In image display devices such as head-mounted displays or projectors, there has been known a color combining element that combines blue light, green light, and red light to emit the combined light. JP-A-2012-230151 described below discloses a projection-type display device including a first display unit configured to emit blue light, a second display unit configured to emit green light, a third display unit configured to emit red light, and a cross dichroic prism configured to combine light rays emitted from each of the display units. In the projection-type display device, each of the display units includes two organic electroluminescence (EL) panels that exhibit different emission peak wavelengths in the wavelength region of the same color, and combines the color light rays emitted from the two organic EL panels by a dichroic mirror.

Traditionally, a dichroic prism that includes a dichroic mirror having polarization separation characteristics has been used as a color combining element for combining light rays from liquid crystal panels. A dichroic prism for liquid crystal panels is designed to meet wavelength separation characteristics in either the P-polarized light or the S-polarized light. While the light emitted from the organic EL panel used in JP-A-2012-230151 contains both the P-polarized light and the S-polarized light and has no polarization characteristics, unlike the case of liquid crystal panels. Accordingly, only one of the S-polarized light and the P-polarized light contained in the light from the organic EL panel is available when the light rays emitted from the organic EL panel are combined by a dichroic prism for liquid crystal panels. That is, in the above combination, there is a drawback that only up to 50% light utilization efficiency can be achieved at the maximum.

In order to resolve the above-described drawback, studies have been conducted to investigate a dichroic mirror for combining light rays that do not have polarization characteristics, like the light emitted from an organic EL panel. However, since such a type of dichroic mirror is practically produced to combine blue light, green light, and red light, there is a drawback in that the light utilization efficiency of red light is particularly low among the three color light rays. Moreover, there is a drawback in that stray light is generated in the dichroic prism.

SUMMARY

To resolve the above-described drawbacks, an image display module according to one aspect of the present disclosure includes a first panel configured to emit first imaging light of a red wavelength region, the first imaging light having no polarization characteristics, a second panel configured to emit second imaging light in a blue wavelength region, the second imaging light having no polarization characteristics, a third panel configured to emit third imaging light of a green wavelength region, the third imaging light having no polarization characteristics, and a color combined prism configured to emit combined light combined from the first imaging light, the second imaging light, and the third light, wherein the color combined prism includes a first dichroic mirror having no polarization separation characteristics, and a second dichroic mirror having no polarization separation characteristics, and a peak wavelength in the red wavelength region is in a range of from 630 nm to 680 nm.

In the image display module according to one aspect of the present disclosure, a utilization efficiency of the first imaging light in the first dichroic mirror and the second dichroic mirror may be equal to or greater than 50%.

In the image display module according to one aspect of the present disclosure, the first dichroic mirror has characteristics of transmitting the third imaging light and reflecting the first imaging light, the second dichroic mirror has characteristics of transmitting the third imaging light and reflecting the second imaging light, and a transmission bandwidth of the third imaging light in the first and second dichroic mirrors may be equal to or greater than 130 nm.

In the image display module according to one aspect of the present disclosure, each of the first panel, the second panel, and the third panel may include a light-emitting element including an organic electroluminescence element.

In the image display module according to one aspect of the present disclosure, the organic electroluminescence element may include an optical resonator.

An image display device according to one aspect of the present disclosure includes the image display module according to one aspect of the present disclosure.

DESCRIPTION OF EXEMPLARY EMBODIMENTS

First Exemplary Embodiment

First Exemplary Embodiment of the present disclosure will be described below with reference to the accompanying drawings.

Figure 1:
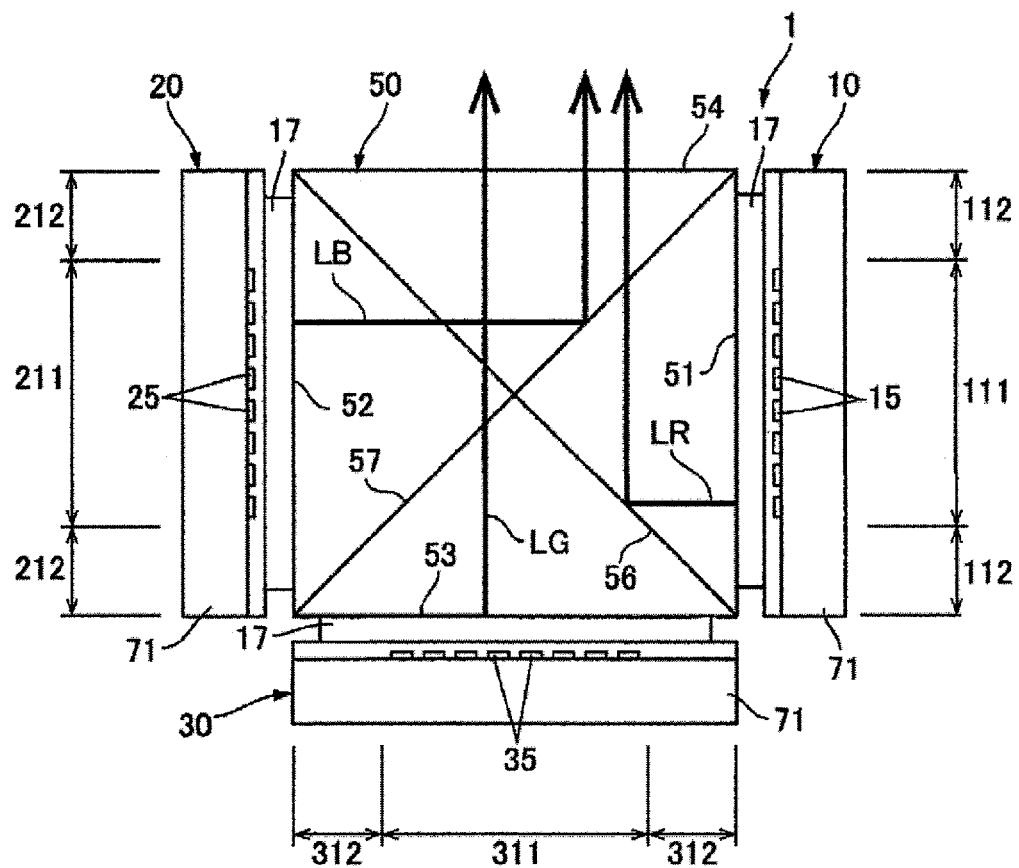
FIG. 1 is a view schematically illustrating a configuration of an image display module according to First Exemplary Embodiment.

FIG. 1 is a view schematically illustrating a configuration of an image display module according to First Exemplary Embodiment.

Note that, in the drawings, the dimensions of some components may be scaled differently for ease of understanding for the components.

The image display module according to First Exemplary Embodiment is configured to emit imaging light combined from a plurality of color light rays from a plurality of image display panels that emit imaging light having no polarization characteristics, such as, for example, organic EL panels.

As illustrated in FIG. 1, an image display module 1 includes a first panel 10, a second panel 20, a third panel 30, and a dichroic prism 50 (color combined prism). The first panel 10 includes a display region 111 in which a plurality of pixels are arranged in a matrix pattern, and a non-display region 112. Each of the plurality of pixels is provided with a light-emitting element 15. The second panel 20 includes a second display region 211 in which a plurality of pixels are arranged in a matrix pattern, and a non-display region 212. Each of the plurality of pixels is provided with a light-emitting element 25. The third panel 30 includes a third display region 311 in which a plurality of pixels are arranged in a matrix pattern, and a non-display region 312. Each of the plurality of pixels is provided with a light-emitting element 35.

In First Exemplary Embodiment, a plurality of light-emitting elements 15 arranged in the display region 111 of the first panel 10 are configured to emit red light or white light. Similarly, a plurality of light-emitting elements 25 arranged in the second display region 211 of the second panel 20 are configured to emit blue light or white light. Similarly, a plurality of light-emitting elements 35 arranged in the third display region 311 of the third panel 30 are configured to emit green light or white light. In First Exemplary Embodiment, each of the light-emitting element 15, the light-emitting element 25, and the light-emitting element 35 is constituted by a top-emission-type organic EL element.

Configurations of the first panel 10, the second panel 20, and the third panel 30 will be described below. Each of the first panel 10, the second panel 20, and the third panel 30 has the same basic configuration, while the first panel 10, the second panel 20, and the third panel 30 are composed of different materials in both the light-emitting layer and the transport layer that are composed of organic EL materials. Accordingly, a configuration of the panels will be described below with reference to the third panel 30 being representative of the three panels.

Figure 2:
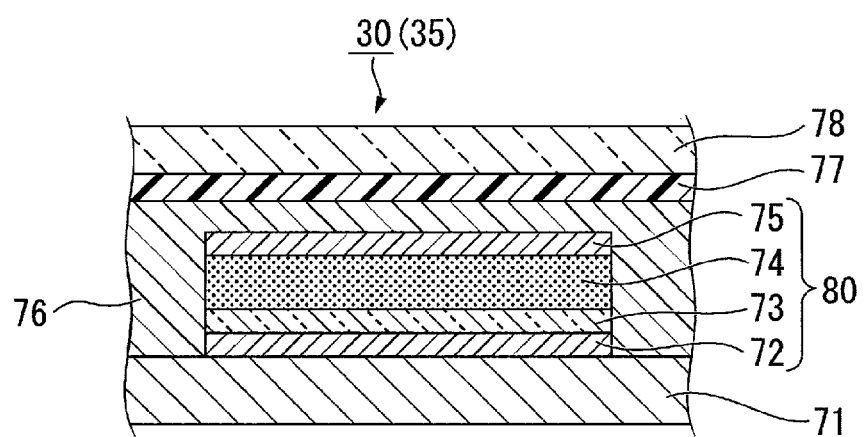
FIG. 2 is a cross-sectional view illustrating a configuration of a display panel.

FIG. 2 is a cross-sectional view illustrating a configuration of one light-emitting element 35 in the third panel 30.

As illustrated in FIG. 2, on one face of a substrate 71, a reflective electrode 72, an anode 73, a light-emitting functional layer 74, and a cathode 75 are provided in that order from the substrate 71 side. The substrate 71 is composed of a semiconductor material such as silicon, for example. The reflective electrode 72 is composed of a conductive material having light reflectivity containing, for example, aluminum, silver, or the like. More specifically, the reflective electrode 72 may be composed of a single material such as aluminum, silver, or the like, or may be composed of a layered film of titanium (Ti)/aluminum-copper alloy (AlCu), or the like.

The anode 73 is composed of a conductive material having optical transparency, such as Indium Tin Oxide (ITO), for example. Although not illustrated, the light-emitting functional layer 74 is constituted by a plurality of layers including a light-emitting layer, a hole injecting layer, an electron injecting layer, and the like that include an organic EL material. The light-emitting layer is composed of a publicly known organic EL material corresponding to each of the light-emission colors of red, green, and blue.

The cathode 75 functions as a semi-transmissive reflective layer having properties (semi-transmissive reflective properties) of transmitting a part of light and reflecting the rest of the light. For example, the cathode 75 having the semi-transmissive reflective properties can be realized by, for example, forming a conductive material having light reflectivity such as an alloy containing silver or magnesium with sufficiently thin film thickness. The light emitted from the light-emitting functional layer 74, in which components having a specific resonance wavelength are selectively amplified while the light is traveling back and forth between the reflective electrode 72 and the cathode 75, passes through the cathode 75, and is then emitted to an observation side (the opposite side to the substrate 71). That is, an optical resonator 80 is constituted by a plurality of layers from the reflective electrode 72 to the cathode 75.

A plurality of layers from the reflective electrode 72 to the cathode 75 are covered with a sealing film 76. The sealing film 76 being a film for preventing penetration of outside air and moisture is constituted by a single layer or a plurality of layers of an inorganic material or an organic material having optical transparency. A color filter 77 is provided on one surface of the sealing film 76. In the third panel 30, the color filter 77 is constituted by a light absorbing type filter layer that absorbs light of a wavelength region other than the green wavelength region and transmits light of the green wavelength region. Similarly, in the first panel 10, the color filter is constituted by a light absorbing type filter layer that absorbs light of a wavelength region other than the red wavelength region and transmits light of the red wavelength region. In the second panel 20, the color filter is constituted by a light absorbing type filter layer that absorbs light of a wavelength region other than the blue wavelength region and transmits light of the blue wavelength region.

In First Exemplary embodiment, since each of the first panel 10, the second panel 20, and the third panel 30 includes the optical resonator 80, a resonance of light at the resonant wavelength causes light corresponding to each of the colors to be emitted. Moreover, the color filter 77 provided on the light emission side of the optical resonator 80 causes the color purity of the light emitted from each of the panels 10, 20, and 30 to be further enhanced.

A cover glass 78 for protecting each of the panels 10, 20, and 30 is provided on one surface of the color filter 77.

As illustrated in FIG. 1, the first panel 10 emits the first imaging light LR of the red wavelength region. Thus, imaging light emitted from the first panel 10 is incident on the dichroic prism 50 as the first imaging light LR of the red wavelength region. The second panel 20 emits the second imaging light LB of the blue wavelength region. Thus, imaging light emitted from the second panel 20 is incident on the dichroic prism 50 as the second imaging light LB of the blue wavelength region. The third panel 30 emits the third imaging light LG of the green wavelength region. Thus, imaging light emitted from the third panel 30 is incident on the dichroic prism 50 as the third imaging light LG of the green wavelength region.

The peak wavelength in the red wavelength region is from 630 nm to 680 nm. The peak wavelength in the blue wavelength region is, for example, from 450 nm to 490 nm. The peak wavelength of the green wavelength region is, for example, from 495 nm to 570 nm. Each of the first imaging light LR, the second imaging light LB, and the third imaging light LG has no polarization characteristics. That is, each of the first imaging light LR, the second imaging light LB, and the third imaging light LG is non-polarized light that has no specific vibration direction. Note that non-polarized light, that is, light that has no polarization characteristics, is not entirely unpolarized, and includes some polarization components, however, the non-polarized light is light having a degree of polarization within a range of light considered not to actively affect the optical performance of an optical component such as a dichroic mirror, that is, for example, light having a degree of polarization of 20% or less.

The dichroic prism 50 is constituted by a light-transmissive member in a square pole shape. The dichroic prism 50 includes a first incident surface 51, a second incident surface 52 that faces the first incident surface 51, a third incident surface 53 that is in perpendicular contact with both the first incident surface 51 and the second incident surface 52, and an emission surface 54 that faces the third incident surface 53.

The dichroic prism 50 includes a first dichroic mirror 56 that does not have polarization separation characteristics, the second dichroic mirror 57 that does not have polarization separation characteristics. The first dichroic mirror 56 and the second dichroic mirror 57 intersect with each other at an angle of 90 degrees. The first dichroic mirror 56 has characteristics of reflecting the first imaging light LR and transmitting the second imaging light LB and the third imaging light LG. The second dichroic mirror 57 has characteristics of reflecting the second imaging light LB and transmitting the first imaging light LR and the third imaging light LG.

The first panel 10 is disposed facing the first incident surface 51. The second panel 20 is disposed facing the second incident surface 52. The third panel 30 is disposed facing the third incident surface 53. In First Exemplary Embodiment, the first panel 10 is fixed to the first incident surface 51 by an adhesive layer 17 having light-transmissive characteristics. The second panel 20 is fixed to the second incident face 52 by an adhesive layer 17 having light-transmissive characteristics. The third panel 30 is fixed to the third incident face 53 by an adhesive layer 17 having light-transmissive characteristics.

Figure 3:
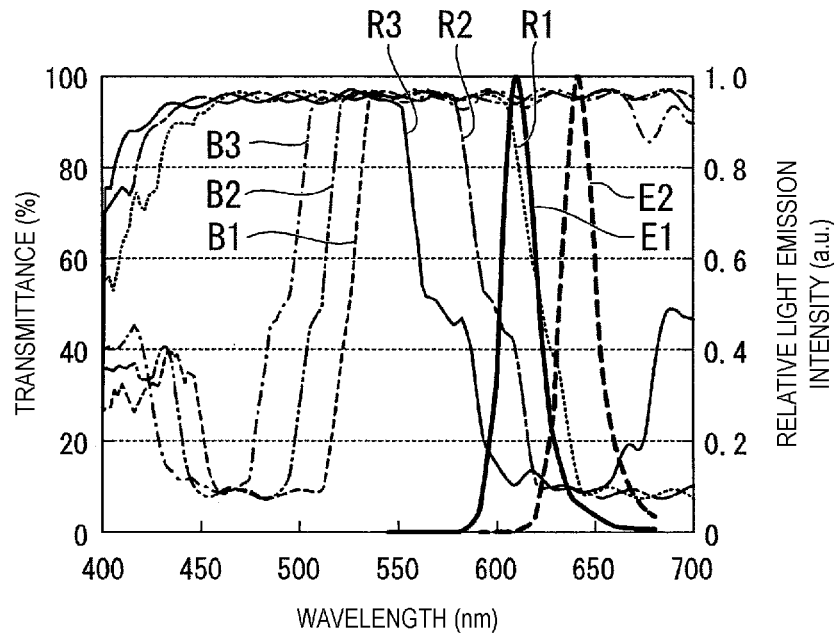
FIG. 3 is a graph illustrating wavelength separation characteristics of a dichroic mirror in a dichroic prism, and an emission spectrum of a light-emitting element.

FIG. 3 is a graph illustrating the wavelength separation characteristics of each of the dichroic mirrors 56 and 57 in the dichroic prism 50, and the emission spectra of the first light-emitting element 15 configured to emit the first imaging light LR of the red wavelength region.

The horizontal axis of the graph represents the wavelength (nm), the vertical axis on the left side represents the transmittance (%) of the dichroic mirrors 56 and 57, and the vertical axis on the right side represents the relative light emission intensity (a.u.) of the first light-emitting element 15. Note that the relative light emission intensity is defined as the light emission intensity at each of the wavelengths when the light emission intensity at the peak wavelength is set at 1.

As illustrated in FIG. 1, each of the first imaging light LR, the second imaging light LB, and the third imaging light LG is designed, basically, to be incident on each of the first dichroic mirror 56 and the second dichroic mirror 57 at an incident angle of 45 degrees. However, in a practical image display module, since each of the imaging light emitted from each of the panels is not parallel light, a light ray is present, which is incident on each of the dichroic mirrors at an incident angle other than 45 degrees. The present inventors conducted a simulation of wavelength separation characteristics of the dichroic mirrors, assuming the range of the incident angle of each of the imaging light rays with respect to each of the dichroic mirrors to be 45±7 degrees.

Thus, FIG. 3 illustrates three graphs of different incident angles for each of the dichroic mirrors.

The graphs denoted by reference signs R1, R2, and R3 represent transmittance curves of the first imaging light LR (red light) for the first dichroic mirror 56.

The graph denoted by reference sign R1 represents the transmittance curve at an incident angle of 38 degrees. The graph denoted by reference sign R2 represents the transmittance curve at an incident angle of 45 degrees. The graph denoted by reference sign R3 represents the transmittance curve at an incident angle of 52 degrees.

The graphs denoted by reference signs B1, B2, and B3 represent transmittance curves of the second imaging light LB (blue light) for the second dichroic mirror 57.

The graph denoted by reference sign B1 represents the transmittance curve at an incident angle of 38 degrees. The graph denoted by reference sign B2 represents the transmittance curve at an incident angle of 45 degrees. The graph denoted by reference sign B3 represents the transmittance curve at an incident angle of 52 degrees.

The graphs denoted by reference signs E1 and E2 represent the emission spectra of the first light-emitting element 15.

The graph denoted by reference sign E1 represents the emission spectrum of the first light-emitting element 15 having light-emission characteristics with a peak wavelength of 610 nm. The graph denoted by reference sign E2 represents the emission spectrum of the first light-emitting element 15 having light-emission characteristics with a peak wavelength of 640 nm.

As recognizable from the graphs with reference signs R1, R2, and R3, the transmittance of the first imaging light LR (red light) takes, at any incident angle, a value greater than 95% in the region where the wavelength is less than 550 nm. However, in a case when the wavelength is longer than 550 nm, the transmittance has a tendency of decreasing at any incident angle, such that when the incident angle is 52 degrees, the cutoff wavelength is approximately 610 nm, when the incident angle is 45 degrees, the cutoff wavelength is approximately 620 nm, and when the incident angle is 38 degrees, the cutoff wavelength is approximately 640 nm.

Note that in the present specification, the wavelength at which the transmittance of the dichroic mirror reaches 10% is defined as the cutoff wavelength.

For example, a dichroic mirror having polarization separation characteristics is used for a dichroic mirror that combines light emitted from a liquid crystal panel. That is, a dichroic mirror which has characteristics of reflecting the S-polarized light of the red and blue wavelength regions and transmitting the P-polarized light of the green wavelength region is used. The transmittance curve of this type of dichroic mirror, although not illustrated in FIG. 3, shifts to a shorter wavelength than the transmittance curve of the dichroic mirror that has no polarization characteristics, illustrated in FIG. 3. Accordingly, even if the peak wavelength of red light emitted from a liquid crystal panel is, for example, 610 nm, a desired utilization efficiency can be obtained without causing any issue for practical use. Note that in a display panel such as a liquid crystal panel, the value being from 610 to 620 nm as the peak wavelength of red light is a standard value in forming a triangle indicating a predefined color gamut in the chromaticity diagram.

However, when using this type of dichroic mirror in organic EL panel applications, the emission spectrum of the red light from the organic EL panel and the transmittance curve of red light of the dichroic mirror largely overlap, thus causing much of the red light that is to be intrinsically reflected to pass through the dichroic mirror. This reduces the utilization efficiency of red light and causes stray light to be generated. For example, focusing attention on the emission spectrum with a peak wavelength of 610 nm denoted by reference sign E1 in FIG. 3 and the transmittance curve at an incident angle of 38 degrees denoted by reference sign R1, in this combination, the light emission spectrum and the transmittance curve largely overlap, thus causing much of the red light that is to be intrinsically reflected to pass through the dichroic mirror. In this case, the utilization efficiency of the first imaging light (red light) is significantly reduced.

In contrast, focusing attention on the emission spectrum with a peak wavelength of 640 nm denoted by reference sign E2 and the transmittance curve at an incident angle of 38 degrees denoted by reference sign R1, in this combination, the emission spectrum and the transmittance curve slightly overlap, thus causing much of the red light that is to be intrinsically reflected to be reflected by the dichroic mirror. Thus, this allows the utilization efficiency of the first imaging light (red light) to be enhanced.

In the present specification, the utilization efficiency is the ratio of the area of the portion within the emission spectrum peak where the transmittance curve do not overlap to the total area of the portion within the emission spectrum peak. Accordingly, greater area of the overlapped portion between the emission spectrum peak and the transmittance curve leads to lower utilization efficiency, and a smaller area of the overlapped portion between the emission spectrum peak and the transmittance curve leads to a higher utilization efficiency.

The present inventors calculated the utilization efficiency, varying the peak wavelength of the first imaging light LR (red light) to be emitted from the first light-emitting element 15.

Figure 4:
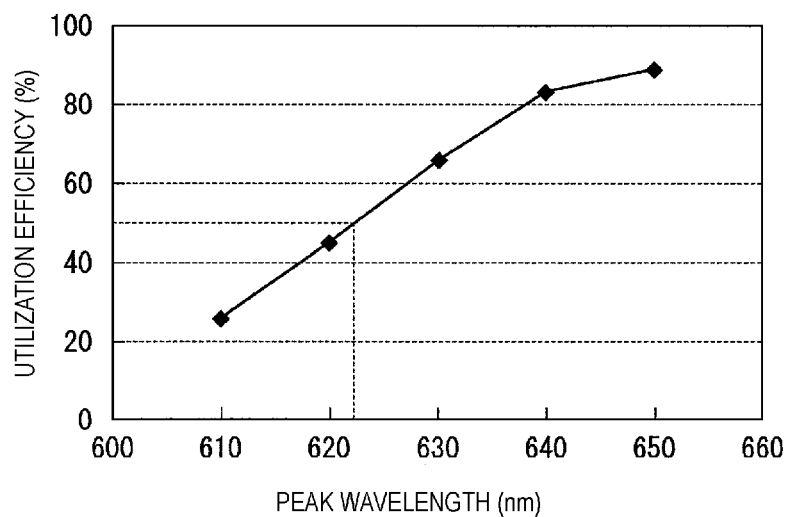
FIG. 4 is a graph illustrating a relationship between a peak wavelength and a light utilization efficiency of red light.

FIG. 4 is a graph illustrating the relationship between the peak wavelength and the utilization efficiency of the first imaging light LR, which exhibits the result of the calculation. In FIG. 4, the horizontal axis represents the peak wavelength (nm), and the vertical axis represents the utilization efficiency (%).

As illustrated in FIG. 4, the utilization efficiency increases as the peak wavelength of the first imaging light LR increases. Specifically, when the peak wavelength is 610 nm, the utilization efficiency is calculated as 26%, when the peak wavelength is 620 nm, the utilization efficiency is calculated as 45%, when the peak wavelength is 630 nm, the utilization efficiency is calculated as 66%, when the peak wavelength is 640 nm, the utilization efficiency is calculated as 83%, and when the peak wavelength is 650 nm, the utilization efficiency is calculated as 89%.

Supposing that light rays from the organic EL element are combined using a dichroic prism having polarization characteristics, the utilization efficiency reaches 50% at the maximum due to the unavailability of one of the S-polarized light and the P-polarized light contained in the light from the organic EL element in the dichroic prism. Accordingly, in case of combining the light rays from the organic EL element using a dichroic prism that has no polarization characteristics, using the dichroic prism is considered useless unless the utilization efficiency at least exceeds 50%.

In this regard, the utilization efficiency exceeds 50% in cases when the peak wavelength is greater than 630 nm as recognized from FIG. 4. Since an image display module 1 according to First Exemplary Embodiment uses the first panel 10 configured to emit the first imaging light LR having a peak wavelength from 630 nm to 680 nm and the dichroic prism 50 including the dichroic mirrors 56 and 57 that have no polarization separation characteristics, the utilization efficiency of the first imaging light LR (red light) reaches 50% or greater, enhancing the utilization efficiency of the first imaging light LR (red light) and suppressing the stray light compared to the case of using a dichroic prism having polarization characteristics.

Note that the peak wavelength of the first imaging light LR exceeding 680 nm unfavorably leads to a low luminosity factor and insufficient luminance.

In FIG. 4, the cutoff wavelength of the first imaging light LR (red light) in the first dichroic mirror 56 is approximately 620 nm when the incident angle is 45 degrees, and the cutoff wavelength of the second imaging light LB (blue light) in the second dichroic mirror 57 is approximately 490 nm when the incident angle is 45 degrees. Accordingly, in the wavelength region between 620 nm being the cutoff wavelength of the first imaging light LR (red light) and 490 nm being the cutoff wavelength of the second imaging light LB (blue light), the third imaging light LG (green light) passes through both the first dichroic mirror 56 and the second dichroic mirror 57.

Provided that the difference between the cutoff wavelength of the first imaging light LR and the cutoff wavelength of the second imaging light LB is defined as a transmission bandwidth of the third imaging light LG, the transmission bandwidth of the third imaging light LG (green light) in the image display module 1 according to First Exemplary Embodiment is approximately 130 nm. The transmission bandwidth of the third imaging light LG (green light) being not less than 130 nm leads to sufficient utilization efficiency of the third imaging light LG, ensuring the luminosity factor of an image.

Moreover, in the case of First Exemplary Embodiment, the first panel 10 is provided with the first light-emitting element 15 including the organic EL element and a red optical resonator, the half bandwidth of the emission spectrum of the first imaging light LR to be emitted from the first panel 10 can be easily narrowed compared to a case where the red optical resonator is not provided. As recognizable from FIG. 3, narrowing the half bandwidth of the light emission spectrum of the first imaging light LR leads to an enhancement of the utilization efficiency of the first imaging light LR in an easier manner.

Second Exemplary Embodiment

Second Exemplary Embodiment of the present disclosure will be described below with reference to the accompanying drawings.

The image display module 1 described in the above-described First Exemplary Embodiments is used in the image display device described below.

Figure 5:
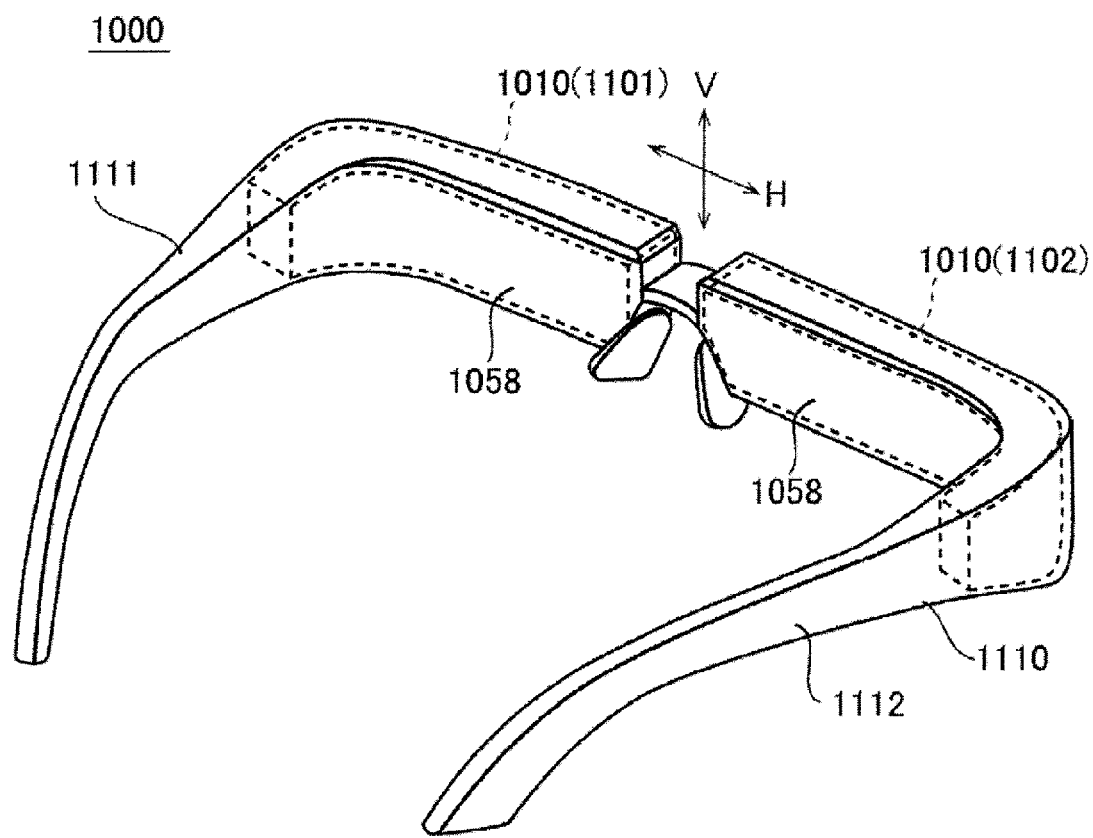
FIG. 5 is a view schematically illustrating a configuration of a head-mounted type display device according to Second Exemplary Embodiment.
Figure 6:
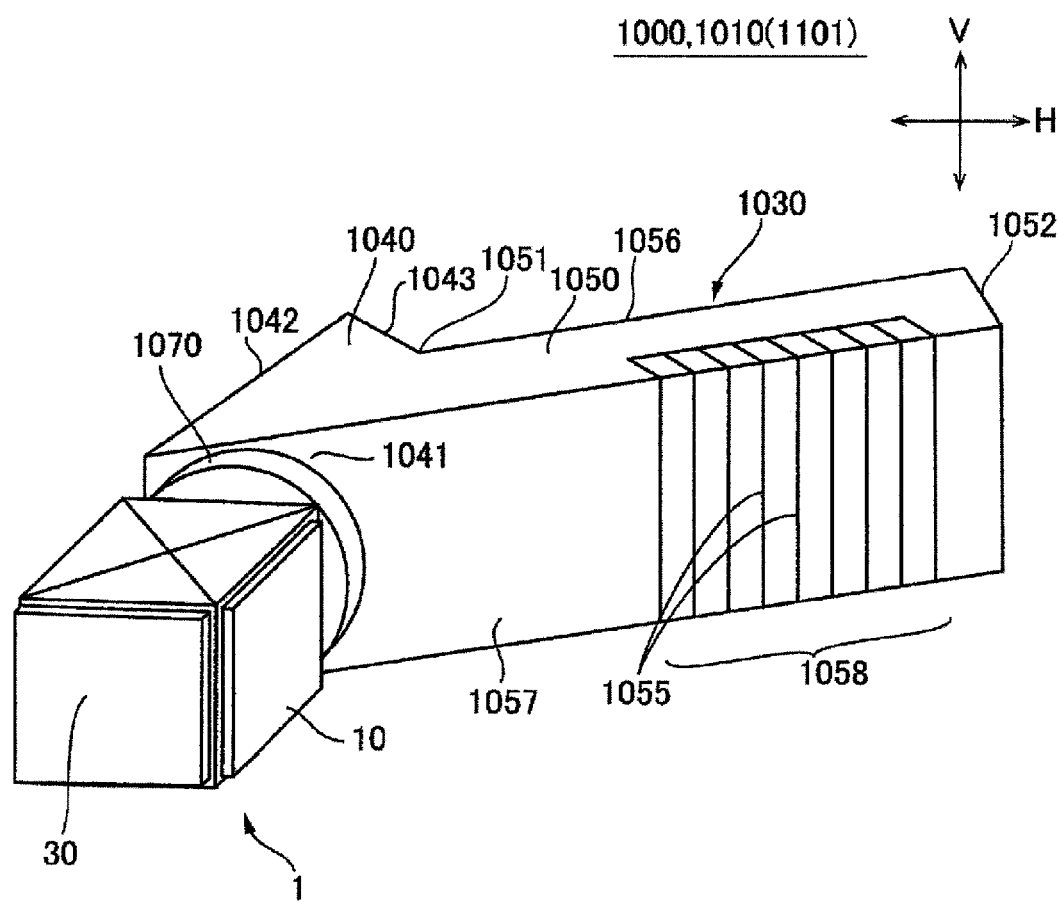
FIG. 6 is a perspective view schematically illustrating a configuration of an optical system of a display unit illustrated in FIG. 5.
Figure 7:
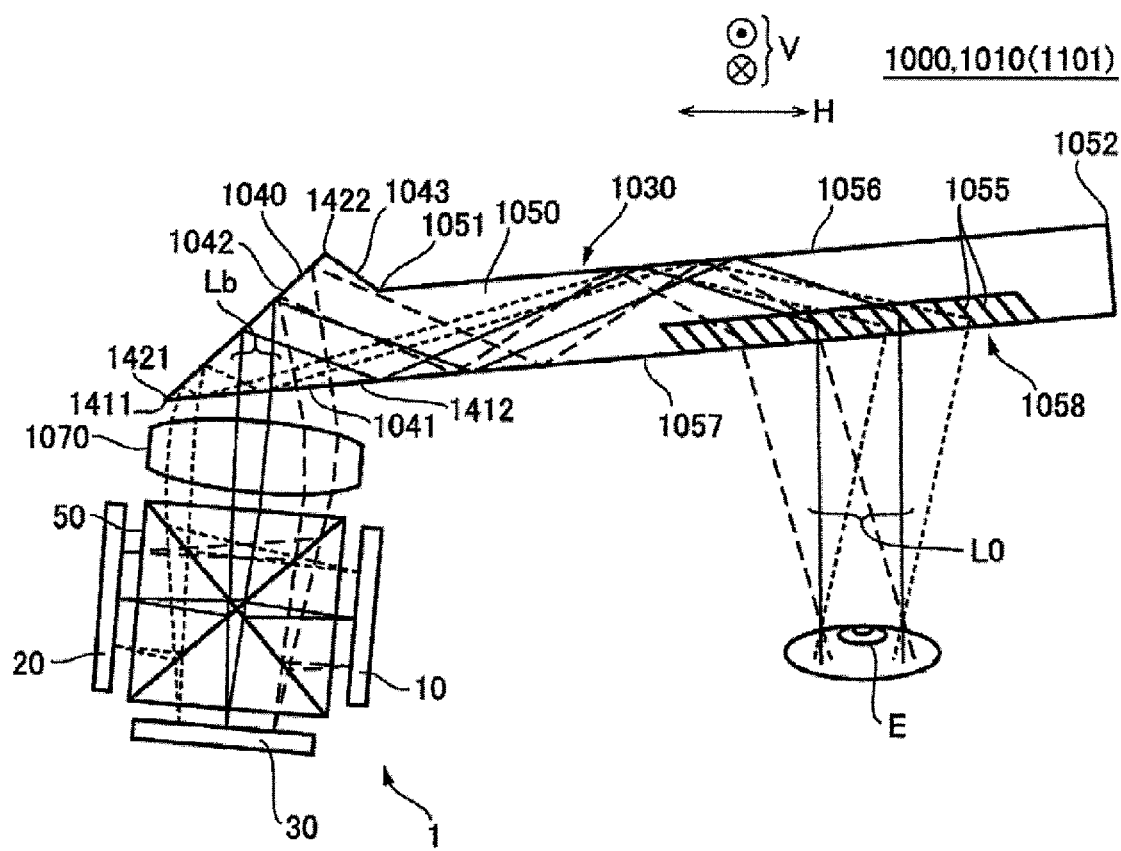
FIG. 7 is a view illustrating optical paths in an optical system illustrated in FIG. 6.

FIG. 5 is an explanatory view of a head-mounted type display device 1000 according to Second Exemplary Embodiment. FIG. 6 is a perspective view schematically illustrating a configuration of an optical system of virtual image display units 1010 illustrated in FIG. 5. FIG. 7 is an explanatory view illustrating optical paths in the optical system illustrated in FIG. 6.

As illustrated in FIG. 5, the head-mounted type display device 1000 (an image display device) is configured as a see-through type eyeglass display, and includes a frame 1110 provided with left and right temples 1111 and 1112. The head-mounted type display device 1000, in which the virtual image display units 1010 are supported by the frame 1110, causes a user to recognize an image emitted from the virtual image display units 1010 as a virtual image. In Second Exemplary Embodiment, the head-mounted type display device 1000 is provided with a left-eye display unit 1101 and a right-eye display unit 1102 as the virtual image display units 1010. The left-eye display unit 1101 and the right-eye display unit 1102 that have the same configuration are disposed left-right symmetrically.

The left-eye display unit 1101 will be mainly described below, and the description of the right-eye display unit 1102 will be omitted.

As illustrated in FIGS. 6 and 7, in the head-mounted type display device 1000, the left-eye display unit 1101 includes the image display module 1, and a light guide system 1030 that guides combined light Lb emitted from the image display module 1 to an emission unit 1058. A projection lens system 1070 is disposed between the image display module 1 and the light guide system 1030, where the combined light Lb emitted from the image display module 1 is incident on the light guide system 1030 via the projection lens system 1070. The projection lens system 1070 is configured of a single collimate lens that has a positive power.

The image display module 1 includes a dichroic prism 50 and three panels 10, 20, and 30 disposed facing three of the four faces (the third face of the triangle pole prism) of the dichroic prism 50. The panels 10, 20, and 30 are constituted by an organic EL panel, for example.

Imaging light emitted from the first panel 10 is incident on the dichroic prism 50 as the first imaging light LR of a first wavelength region. Imaging light emitted from the second panel 20 is incident on the dichroic prism 50 as the second imaging light LB of a second wavelength region. Imaging light emitted from the third panel 30 is incident on the dichroic prism 50 as the third imaging light LG of a third wavelength region. From the dichroic prism 50, the combined light Lb combined from the first imaging light LR, the second imaging light LB, and the third imaging light LG is emitted.

In Second Exemplary Embodiment, the first wavelength region is from 630 nm to 680 nm, for example, and the first panel 10 emits the first imaging light LR of red color. The second wavelength region is from 450 nm to 495 nm, for example, and the second panel 20 emits the second imaging light LB of blue color. The third wavelength region is from 495 nm to 570 nm, for example, and the third panel 30 emits the third imaging light LG of green color. In Second Exemplary Embodiment, the first imaging light LR, the second imaging light LB, and the third imaging light LG are non-polarized light rays.

The light guide system 1030 is provided with an incident unit 1040 having light-transmissive characteristics on which the combined light Lb is incident, and a light guide unit 1050 having light-transmissive characteristics, one end 1051 side of which is coupled to the incident unit 1040. In Second Exemplary Embodiment, the incident unit 1040 and the light guide unit 1050 are configured as an integrated light-transmissive member.

The incident unit 1040 is provided with an incident surface 1041 on which the combined light Lb emitted from the image display module 1 is incident, and a reflection surface 1042 that reflects the combined light Lb that is incident from the incident surface 1041 between the reflection surface 1042 and the incident surface 1041. The incident surface 1041 is a flat surface, an aspherical surface, a free form surface, or the like, and faces the image display module 1 by intervening the projection lens system 1070. The projection lens system 1070 is disposed obliquely such that an interval between the projection lens system 1070 and an end portion 1412 of the incident surface 1041 is larger than an interval between the projection lens system 1070 and an end portion 1411 of the incident surface 1041.

The incident surface 1041, on which a reflective film is not formed, fully reflects light that is incident at an incident angle being not less than the critical angle. Therefore, the incident surface 1041 has both optical transparency and reflectivity. The reflection surface 1042 includes a surface facing the incident surface 1041 and is disposed obliquely such that an end portion 1422 of the reflection surface 1042 is separated farther from the incident surface 1041 than an end portion 1421 of the incident surface 1041. Thus, the incident unit 1040 has a substantially triangular shape. The reflection surface 1042 is a flat surface, an aspherical surface, a free form surface, or the like. The reflection surface 1042 has a configuration in which a reflective metal layer, mainly composed of aluminum, silver, magnesium, chrome or the like, is formed.

The light guide unit 1050 is provided with a first surface 1056 (a first reflection surface) that extends from one end 1051 to another end 1052 side, a second surface 1057 (a second reflection surface) that faces in parallel to the first surface 1056 and extends from the one end 1051 side to the other end 1052 side, and the emission unit 1058 provided on a portion of the second surface 1057 that is separated from the incident unit 1040. The first surface 1056 and the reflection surface 1042 of the incident unit 1040 are joined together by an inclined surface 1043. A thickness of the first surface 1056 and the second surface 1057 is thinner than the incident unit 1040. The first surface 1056 and the second surface 1057 reflect all the light that is incident at an incident angle being not less than the critical angle, based on a refractive index difference between the light guide unit 1050 and the outside (the air). Thus, the first surface 1056 and the second surface 1057 are not formed with a reflective film or the like.

The emission unit 1058 is configured on a part of the light guide unit 1050 on the second surface 1057 side in the thickness direction of the light guide unit 1050. In the emission unit 1058, a plurality of partial reflection surfaces 1055 that are inclined obliquely with respect to a normal line with respect to the second surface 1057 are arranged to be mutually parallel to each other. The emission unit 1058 is a portion, which overlaps the plurality of partial reflection surfaces 1055, of the second surface 1057, and is a region having a predetermined width in an extending direction of the light guide unit 1050. Each of the plurality of partial reflection surfaces 1055 is composed of a dielectric multi-layer film. Further, at least one of the plurality of partial reflection surfaces 1055 may be a composite layer of a dielectric multilayer film and a reflective metal layer (thin film) mainly composed of aluminum, silver, magnesium, chrome, or the like. When the partial reflection surface 1055 is configured to include a metal layer, an effect can be obtained to improve the reflectance of the partial reflection surface 1055, or an effect that an incident angle dependence or the polarization dependence of the transmittance and the reflectance of the partial reflection surface 1055 can be optimized. Note that the emission unit 1058 may have an aspect in which an optical element, such as a diffraction grating, a hologram, or the like is provided.

In the head-mounted type display device 1000 thus configured, the combined light Lb composed of the parallel light having been incident from the incident unit 1040, is refracted by the incident surface 1041 and is oriented toward the reflection surface 1042. Next, the combined light Lb is reflected by the reflection surface 1042, and is oriented toward the incident surface 1041 again. At this time, the combined light Lb, which is incident on the incident surface 1041 at an incident angle being not less than the critical angle, is reflected by the incident surface 1041 toward the light guide unit 1050 and is oriented toward the light guide unit 1050. Note that, in the incident unit 1040, a configuration is used in which the combined light Lb that is the parallel light is incident on the incident surface 1041, but a configuration may be adopted in which the incident surface 1041 and the reflection surface 1042 are configured to have a free form curve or the like, and after the combined light Lb being non-parallel light is incident on the incident surface 1041, the combined light Lb is reflected between the reflection surface 1042 and the incident surface 1041 and is converted to parallel light while being reflected.

In the light guide unit 1050, the combined light Lb is reflected between the first surface 1056 and the second surface 1057, and advances. Then, a part of the combined light Lb that is incident on the partial reflection surface 1055 is reflected by the partial reflection surface 1055 and is emitted from the emission unit 1058 toward an eye E of an observer. Further, the rest of the combined light Lb incident on the partial reflection surface 1055 passes through the partial reflection surface 1055 and is incident on the next, adjacent, partial reflection surface 1055. As a result, the combined light Lb that is reflected by each of the plurality of partial reflection surfaces 1055 is emitted from the emission unit 1058 toward the eye E of the observer. Therefore, the observer can recognize a virtual image.

At this time, with regard to the light from the outside, the light that is incident on the light guide unit 1050 from the outside passes through the partial reflection surfaces 1055 after being incident on the light guide unit 1050, and reaches the eye E of the observer. As a result, the observer can see the color image emitted from the image display module 1 and can also see the outside scenery and the like in a see through manner.

The head-mounted type display device 1000 according to Second Exemplary Embodiment, which includes the image display module 1 according to First Exemplary Embodiment, has high utilization efficiency of the first imaging light LR, and generates less stray light and has high display quality.

Third Exemplary Embodiment

Third Exemplary Embodiment of the present disclosure will be described below with reference to FIG. 8.

The image display module 1 described in the above-described First Exemplary Embodiment is used in a display device described below.

Figure 8:
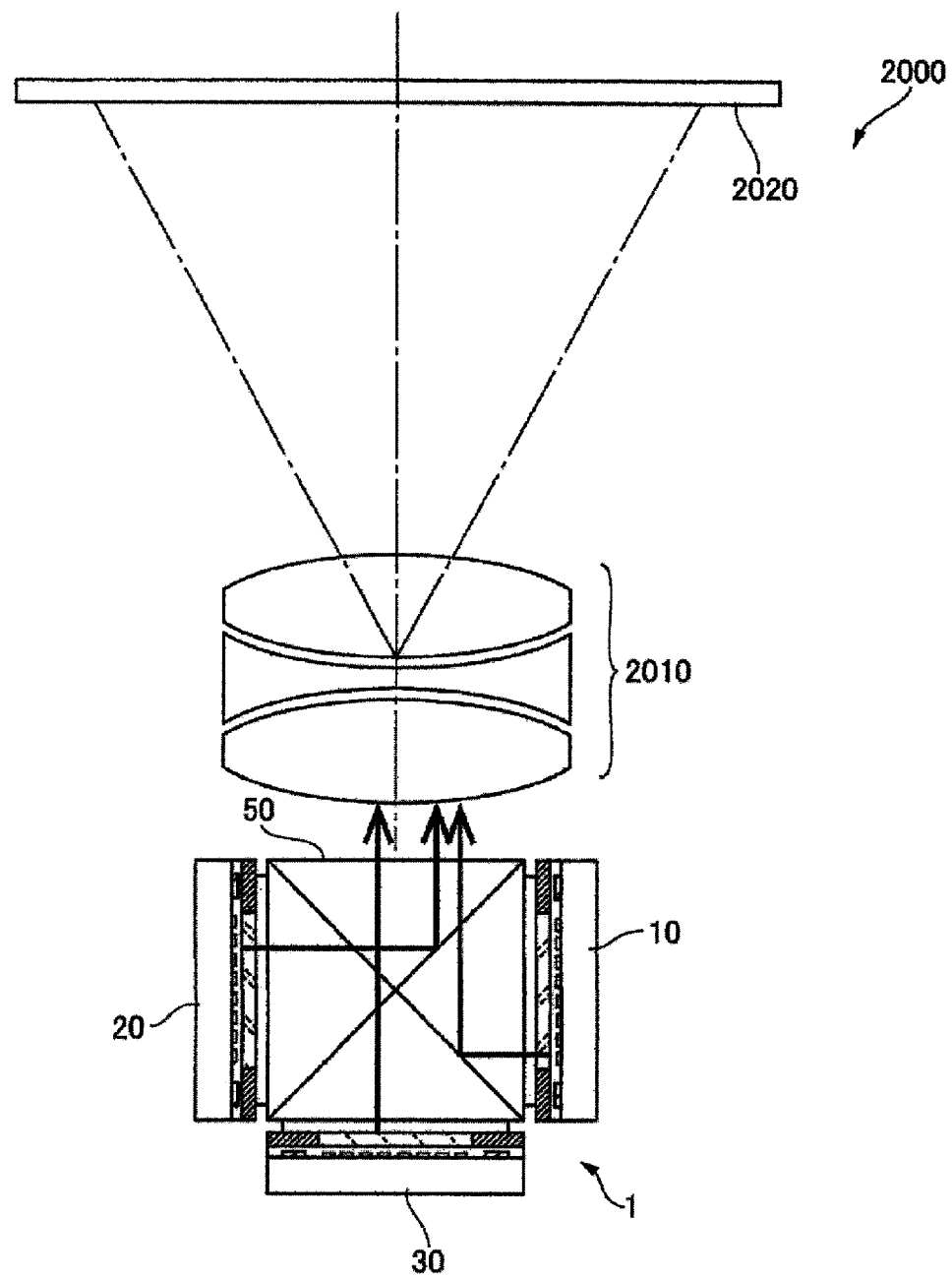
FIG. 8 is a view schematically illustrating a configuration of a projection-type display device according to Third Exemplary Embodiment.

FIG. 8 is a view schematically illustrating a configuration of a projection-type display device 2000 according to Third Exemplary Embodiment.

As illustrated in FIG. 8, the projection-type display device 2000 (an image display device) includes the image display module 1 according to the above-described exemplary embodiments, and a projection optical system 2010 that expands and projects the combined light Lb emitted from the image display module 1 onto a projection receiving member 2020 such as a screen or the like.

The image display module 1 includes a dichroic prism 50 and three panels 10, 20, and 30 disposed facing three of the four faces (the third face of the triangle pole prism) of the dichroic prism 50. The panels 10, 20, and 30 are configured from a panel configured to emit imaging light that has no polarization characteristics such as an organic EL panel, for example.

The projection-type display device 2000 according to Third Exemplary Embodiment, which includes the image display module 1 according to First Exemplary Embodiment, has a high utilization efficiency of the first imaging light LR, and generates less stray light and has a high display quality.

Note that the technical scope of the present disclosure is not limited to the above-described exemplary embodiments, and various modifications can be made to the above-described exemplary embodiments without departing from the spirit and gist of the present disclosure.

For example, specific configurations such as materials, numbers, arrangements, shapes, and the like of each of the components of the image display module and the image display device exemplified in the above-described exemplary embodiments can be modified as appropriate.

In the above-described exemplary embodiments, an example is given in which an organic EL panel is used for the first panel, the second panel, and the third panel constituting the image display module, however, a self-luminous type panel that has no polarization characteristics such as an inorganic EL panel, a micro LED panel, or the like may be used for the image display panel without being limited to the organic EL panel.

Examples of the image display device provided with the image display module described in the above-described exemplary embodiments include an electronic view finder (EVF) or the like used in an imaging device, such as a video camera or a still camera.

What is claimed is:

1. An image display module comprising:
a first panel configured to emit first imaging light of a red wavelength region, the first imaging light having no polarization characteristics;
a second panel configured to emit second imaging light of a blue wavelength region, the second imaging light having no polarization characteristics;
a third panel configured to emit third imaging light of a green wavelength region, the third imaging light having no polarization characteristics; and
a color combined prism configured to emit combined light combined from the first imaging light, the second imaging light, and the third light, wherein
the color combined prism includes a first dichroic mirror having no polarization separation characteristics, and a second dichroic mirror having no polarization separation characteristics, the first dichroic mirror having a non-polarized cutoff wavelength,
the first imaging light emitted from the first panel has a non-polarized peak wavelength that is in a range of from 630 nm to 680 nm, is not less than 630 nm, and is not more than 680 nm, and
the non-polarized peak wavelength of the first imaging light emitted from the first panel is longer than a-the non-polarized cutoff wavelength of the first dichroic mirror.

2. The image display module according to claim 1, wherein a utilization efficiency of the first imaging light in the first dichroic mirror and the second dichroic mirror is equal to or greater than 50%.

3. The image display module according to claim 1, wherein the first dichroic mirror has characteristics of transmitting the third imaging light and reflecting the first imaging light, the second dichroic mirror has characteristics of transmitting the third imaging light and reflecting the second imaging light, and a transmission bandwidth of the third imaging light in the first dichroic mirror and the second dichroic mirror is equal to or greater than 130 nm.

4. The image display module according to claim 1, wherein each of the first panel, the second panel, and the third panel includes a light-emitting element including an organic electroluminescence element.

5. The image display module according to claim 4, wherein the organic electroluminescence element includes an optical resonator.

6. An image display device, comprising the image display module according to claim 1.

* * * * *